US008269564B2

United States Patent
Lu et al.

(10) Patent No.: US 8,269,564 B2
(45) Date of Patent: Sep. 18, 2012

(54) FREQUENCY SETTING CIRCUIT AND METHOD FOR AN INTEGRATED CIRCUIT

(75) Inventors: Shao-Hung Lu, Taoyuan (TW); Isaac Y. Chen, Jubei (TW)

(73) Assignee: Richtek Technology Corp., Hsinchu (TW)

( * ) Notice: Subject to any disclaimer, the term of this patent is extended or adjusted under 35 U.S.C. 154(b) by 32 days.

(21) Appl. No.: 13/087,515

(22) Filed: Apr. 15, 2011

(65) Prior Publication Data

US 2011/0260799 A1    Oct. 27, 2011

(30) Foreign Application Priority Data

Apr. 21, 2010   (TW) .............................. 99112513 A (51) Int. Cl.
*H03B 1/00*   (2006.01)
(52) U.S. Cl. .................... 331/44; 331/68; 331/177 R (58) Field of Classification Search .................... 331/44, 331/68, 108 D, 177 R
See application file for complete search history.

(56) References Cited

U.S. PATENT DOCUMENTS

| | | | | |
|---|---|---|---|---|
| 6,624,710 B2 * | 9/2003 | Tian | ............................. | 331/179 |
| 7,196,589 B1 * | 3/2007 | Silva et al. | ...................... | 331/49 |
| 7,301,408 B2 * | 11/2007 | Sutardja | .......................... | 331/44 |

* cited by examiner

*Primary Examiner* — Ryan Johnson
(74) *Attorney, Agent, or Firm* — Rosenberg, Klein & Lee (57) ABSTRACT

A frequency setting circuit and method for an integrated circuit detect the voltage at a pin of the integrated circuit during a frequency setting period, and determine a frequency setting signal according to the detected voltage to set the frequency of a clock provided by an oscillator in the integrated circuit. After setting the frequency, the frequency setting circuit and method store the frequency setting signal and stop detecting the voltage at the pin. Thus the pin can be used for other functions.

12 Claims, 7 Drawing Sheets

FREQUENCY SETTING CIRCUIT AND METHOD FOR AN INTEGRATED CIRCUIT

FIELD OF THE INVENTION

The present invention is related generally to a circuit and method for frequency setting of integrated circuits and, more particularly, to a frequency setting circuit and method implemented by digital circuits.

BACKGROUND OF THE INVENTION

Figure 1:
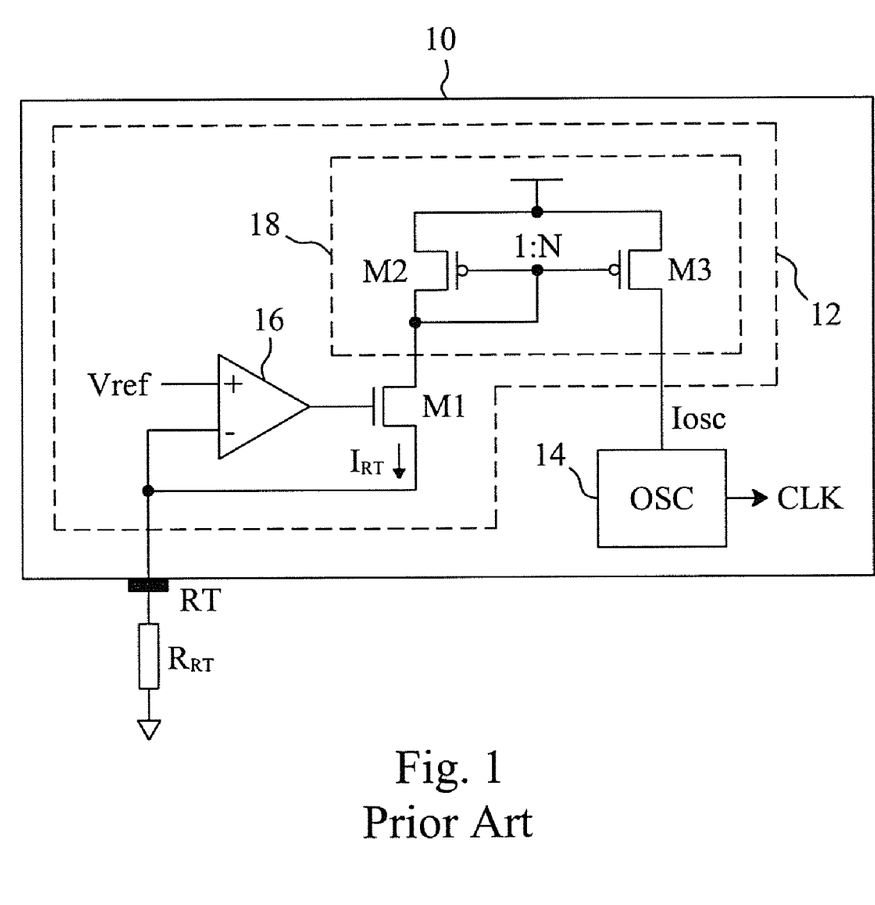
FIG. 1 is a conventional frequency setting circuit.
Figure 2:
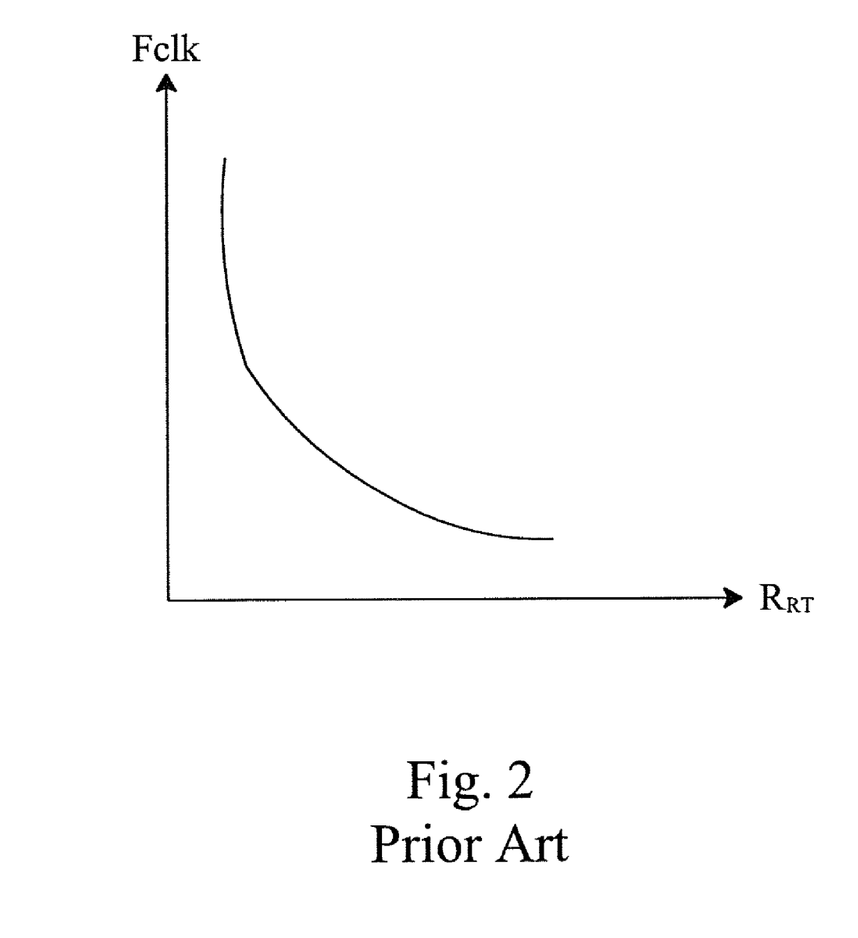
FIG. 2 is a graph showing the relationship between the clock frequency and the resistance in the circuit of FIG. 1.

For integrated circuits (ICs), traditional design needs external frequency setting with dedicated pin to continuous setting. Therefore, the pin count is more and more critical, especially in low pin count ICs. For example, referring to FIG. 1, an IC 10 has a pin RT to be connected with an external resistor $R_{RT}$, a frequency setting circuit 12 to determine a frequency setting signal Iosc depending on the resistance of the resistor $R_{RT}$, and an oscillator 14, according to the frequency setting signal Iosc, to generate a clock CLK with the frequency $$Fclk = k1 \times Iosc, \quad [\text{Eq-1}]$$

where k1 is a proportionality coefficient. The frequency setting circuit 12 includes an operational amplifier 16, a transistor M1 and a current mirror 18 established by transistors M2 and M3. The operational amplifier 16, the transistor M1 and the resistor $R_{RT}$ establish a voltage-to-current converter to convert a voltage Vref into a current $$I_{RT} = Vref/R_{RT}, \quad [\text{Eq-2}]$$

which is mirrored by the current mirror 18 to generate the frequency setting signal $$Iosc = N \times I_{RT}, \quad [\text{Eq-3}]$$

where N is the size ratio between the transistors M2 and M3. By applying the equations Eq-2 and Eq-3 to the equation Eq-1, it is derived $$Fclk = k1 \times N \times Vref/R_{RT}, \quad [\text{Eq-4}]$$

which depicts that the frequency Fclk is inversely proportional to the resistance $R_{RT}$, or as the curve shown in FIG. 2.

In such designs as that shown in FIG. 1, it needs a pin RT for frequency setting from outside of the IC 10. Moreover, to maintain the set frequency Fclk, the pin RT has to be continuously used. With integrated functions increasing, the pins of an IC will be not enough to support, especially in low pin count ICs. Hence, there have been more and more solutions directed to the technique of multi-function pin. For example, U.S. Pat. No. 7,196,589 uses a single pin to implement the functions of frequency setting and frequency synchronization.

SUMMARY OF THE INVENTION

An objective of the present invention is to provide a frequency setting circuit and method to share a common pin with other functions.

Another objective of the present invention is to provide a frequency setting circuit and method implemented by digital circuits for an IC.

According to the present invention, a frequency setting circuit for an integrated circuit includes an analog-to-digital converter to detect the voltage at a pin of the integrated circuit to generate a first digital signal, a storage element to determine a second digital signal according to the first digital signal and store the second digital signal, and a digital-to-analog converter to generate a frequency setting signal according to the second digital signal to set the frequency of a clock provided by an oscillator in the integrated circuit.

According to the present invention, a frequency setting method for an integrated circuit includes detecting the value of a frequency setting device to generate a first digital signal, determining a second digital signal according to the first digital signal, storing the second digital signal, and determining a frequency setting signal according to the second digital signal to set the frequency of a clock provided by an oscillator in the integrated circuit.

The frequency setting circuit according to the present invention is constructed from digital circuits and thus is capable of storing the frequency setting signal. After setting the frequency, the frequency setting circuit can maintain the frequency of the clock according to the frequency setting signal it stores, without keeping detecting the voltage at the pin. In other words, after the frequency setting, the pin can be used to implement other functions.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 3:
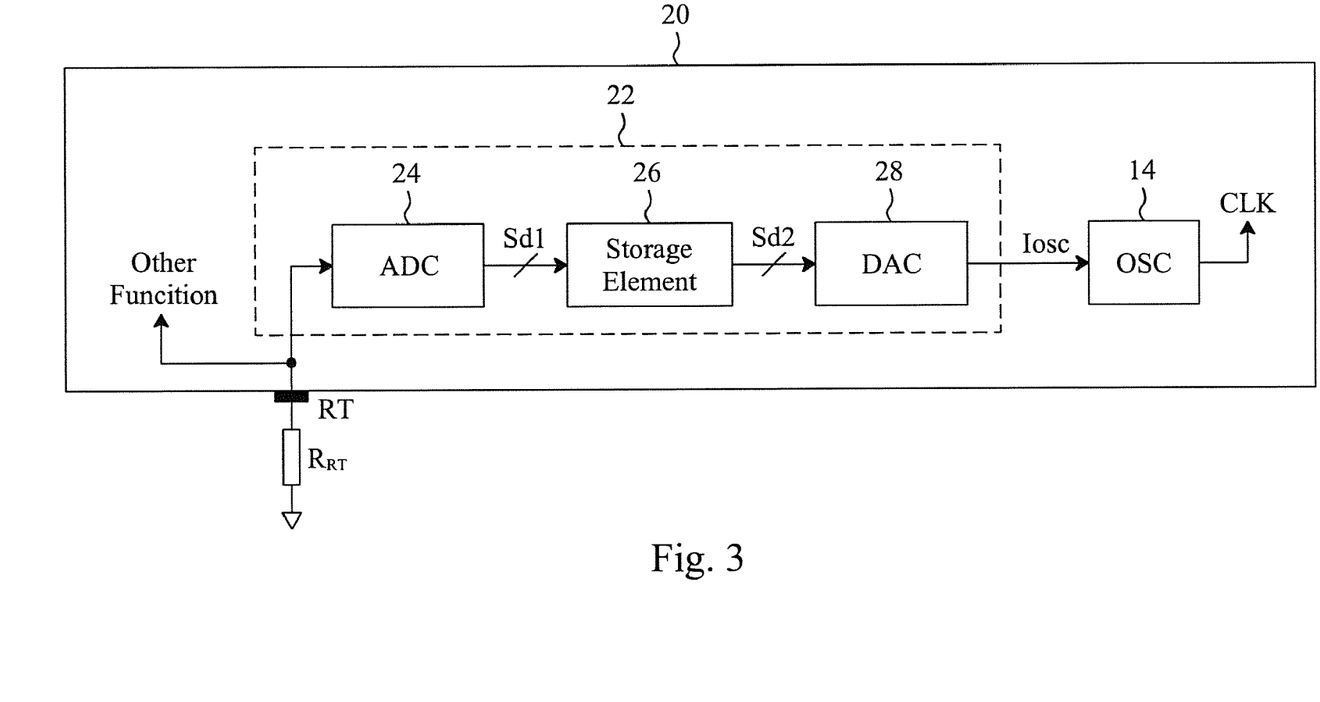
FIG. 3 is an embodiment according to the present invention.
Figure 4:
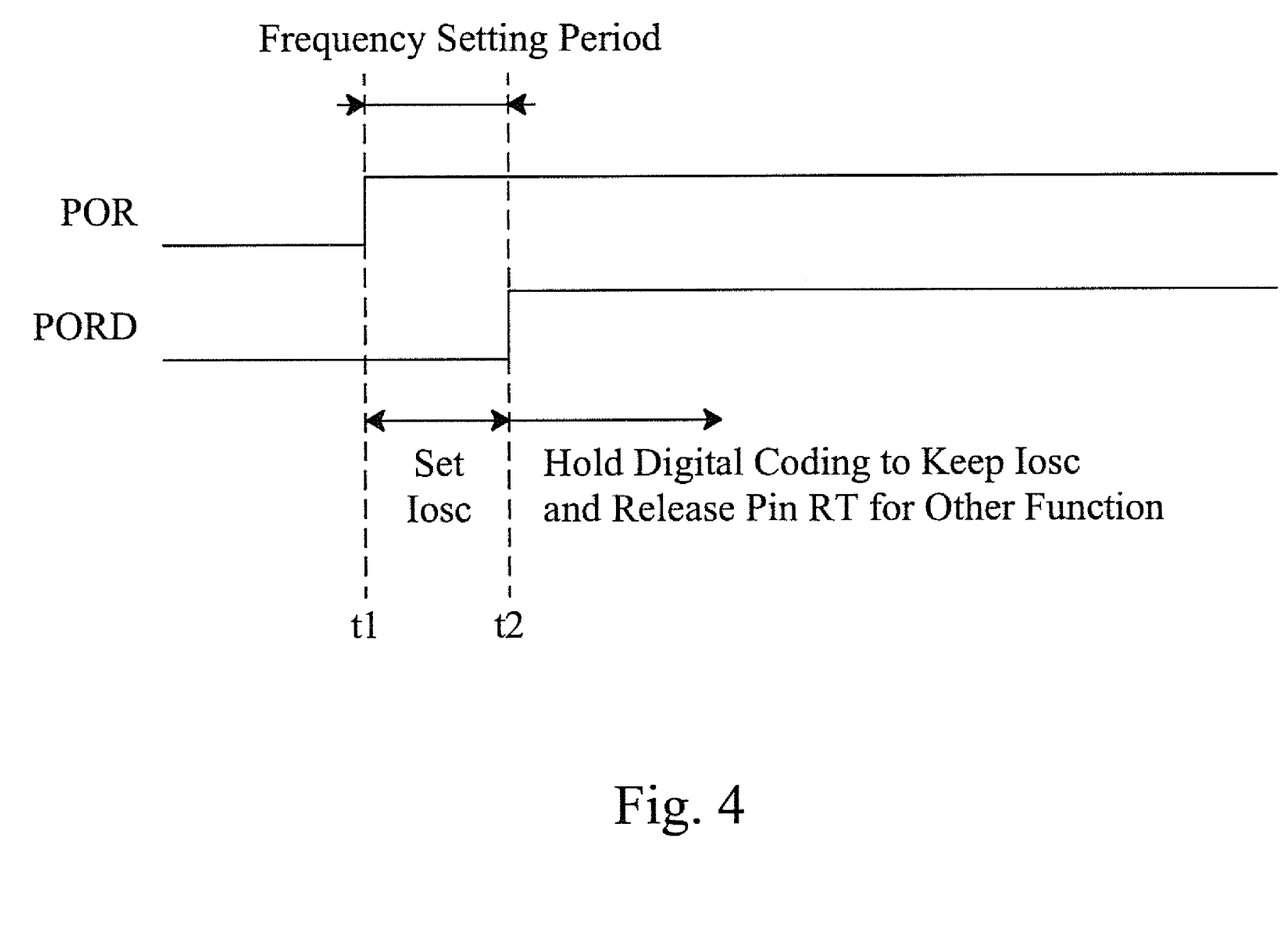
FIG. 4 is a diagram showing an operation of the frequency setting circuit of FIG. 3.

As shown in FIG. 3, a power IC 20 has a pin RT to be connected with a resistor $R_{RT}$ that functions as a frequency setting device, a frequency setting circuit 22 to detect the resistance of the resistor $R_{RT}$ by detecting the voltage at the pin RT and accordingly, to generate a frequency setting signal Iosc, and an oscillator 14 to generate a clock CLK having a frequency Fclk depending on the frequency setting signal Iosc. The frequency setting circuit 22 includes an analog-to-digital converter (ADC) 24, a storage element 26 and a digital-to-analog converter (DAC) 28. The ADC 24 detects the voltage $V_{RT}$ at the pin RT during a frequency setting period which may be a power soft-start period of the power IC 20, as shown in FIG. 4 for example, from time t1 to time t2. When the power-on reset signal POR turns to high at time t1, the power IC 20 starts up and enters a soft-start process and the frequency setting status. At this time, the ADC 24 in the frequency setting circuit 22 is enabled to detect the voltage $V_{RT}$ at the pin RT to generate a first digital signal Sd1. The storage element 26 generates a second digital signal Sd2 according to the first digital signal Sd1, and stores the second digital signal Sd2 for the DAC 28 to determine the frequency setting signal Iosc. The DAC 28 may use a lookup table to determine the frequency setting signal Iosc. When the soft-start end signal PORD turns to high at time t2, the power IC 20 finishes the soft start and the frequency setting status, and enters its normal operation state while the ADC 24 is disabled. However, since the storage element 26 stores the second digital signal Sd2, the DAC 28 is able to maintain the frequency setting signal Iosc, so that the frequency setting circuit 22 has not to keep detecting voltage at the pin RT. As a result, once the power IC 20 accomplishes frequency setting, the pin RT becomes free and can be used to implement other functions. For instance, the pin RT may be designed to output a control signal for switching a low side power switch. Thereby, the number of the pins required by the power IC 20 is reduced.

In other embodiments, the resistor $R_{RT}$ on the pin RT may be replaced by a capacitor or diodes. For example, various numbers of diodes connected in series may be used to change the voltage $V_{RT}$ at the pin RT.

Figure 5:
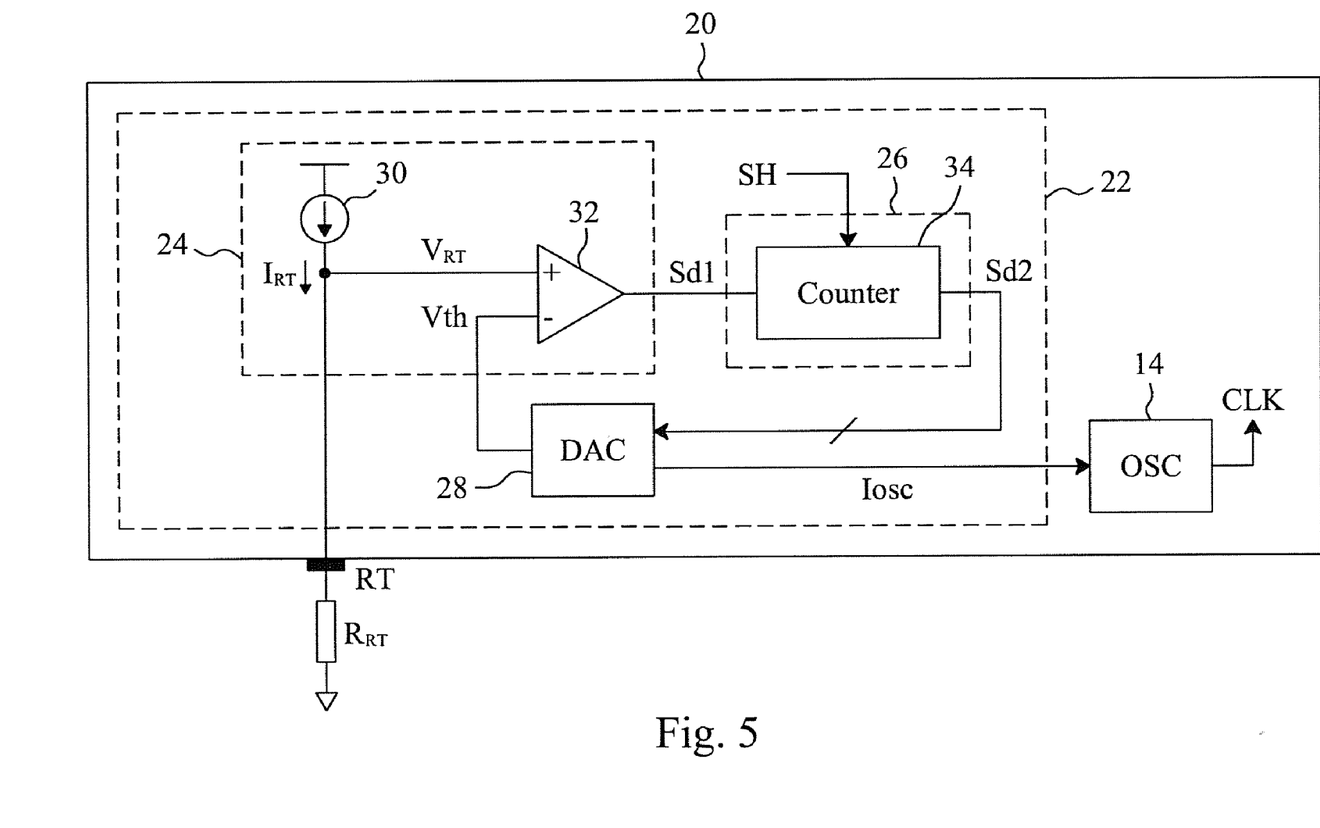
FIG. 5 is a first embodiment for the ADC, the storage element and the DAC of FIG. 3.
Figure 6:
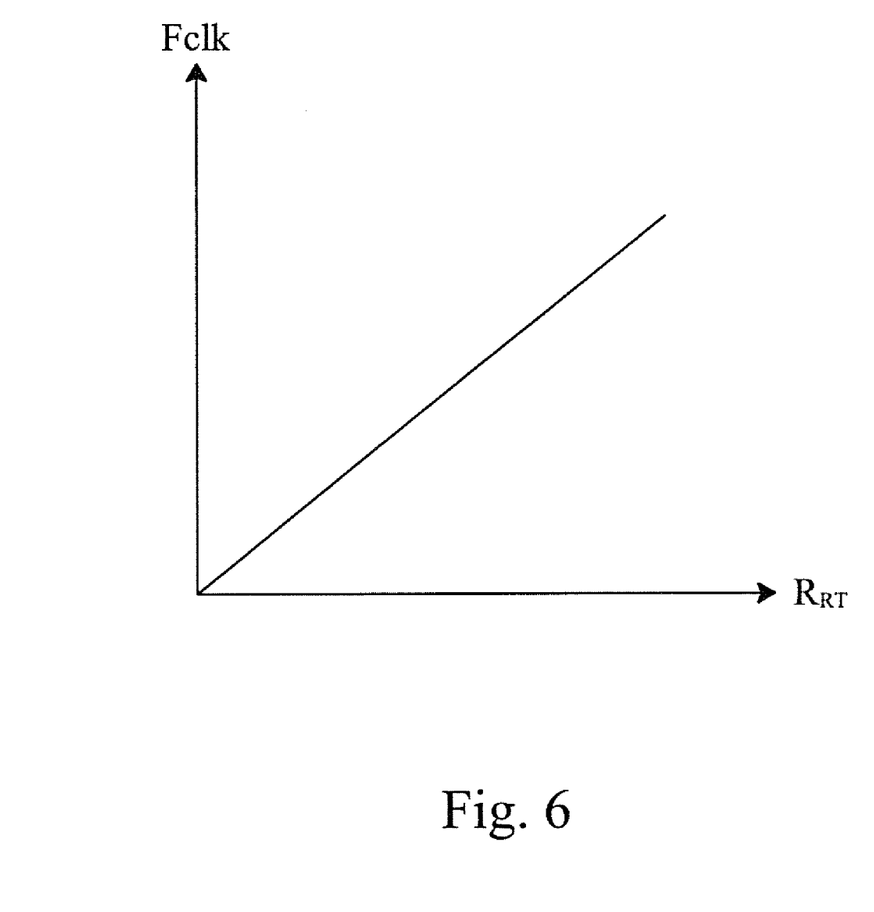
FIG. 6 is a graph showing the relationship between the clock frequency and the resistance in the circuit of FIG. 5.

FIG. 5 is a first embodiment for the ADC 24, the storage element 26 and the DAC 28 of FIG. 3. In the ADC 24, a current source 30 provides a constant current $I_{RT}$ to the pin RT, so as to generate a constant voltage $$V_{RT}=I_{RT}\times R_{RT}, \quad [\text{Eq-5}]$$

and a comparator 32 compares the voltage $V_{RT}$ with a threshold Vth to generate the first digital signal Sd1. The storage element 26 has a counter 34 to adjust the second digital signal Sd2 by counting the first digital signal Sd1, and to store the second digital signal Sd2 in response to a sampling signal SH. The soft-start end signal PORD of FIG. 4 may be used as the sampling signal SH and thus, when the soft-start end signal PORD turns to high from low at time t2, the counter 34 will store the second digital signal Sd2. The DAC 28 generates the frequency setting signal Iosc and the threshold Vth according to the second digital signal Sd2. The counter 34 adjusts the second digital signal Sd2 according to the first digital signal Sd1, so as to make the threshold Vth vary toward the voltage $V_{RT}$. Assuming that the frequency setting signal $$Iosc=k2\times Vth, \quad [\text{Eq-6}]$$

where k2 is a proportionality coefficient, and the threshold Vth is equal to the voltage $V_{RT}$, by substituting the equations Eq-5 and Eq-6 to the equation Eq-1, it is derived that the clock CLK has the frequency $$Fclk=k1\times k2\times I_{RT}\times R_{RT}, \quad [\text{Eq-7}]$$

which shows that the frequency Fclk is proportional to the resistance $R_{RT}$. As long as the counter 34 and the DAC 28 have enough bits N, the frequency setting circuit 22 is able to realize stepless frequency setting as a traditional analog circuit, as the curve shown in FIG. 6.

Figure 7:
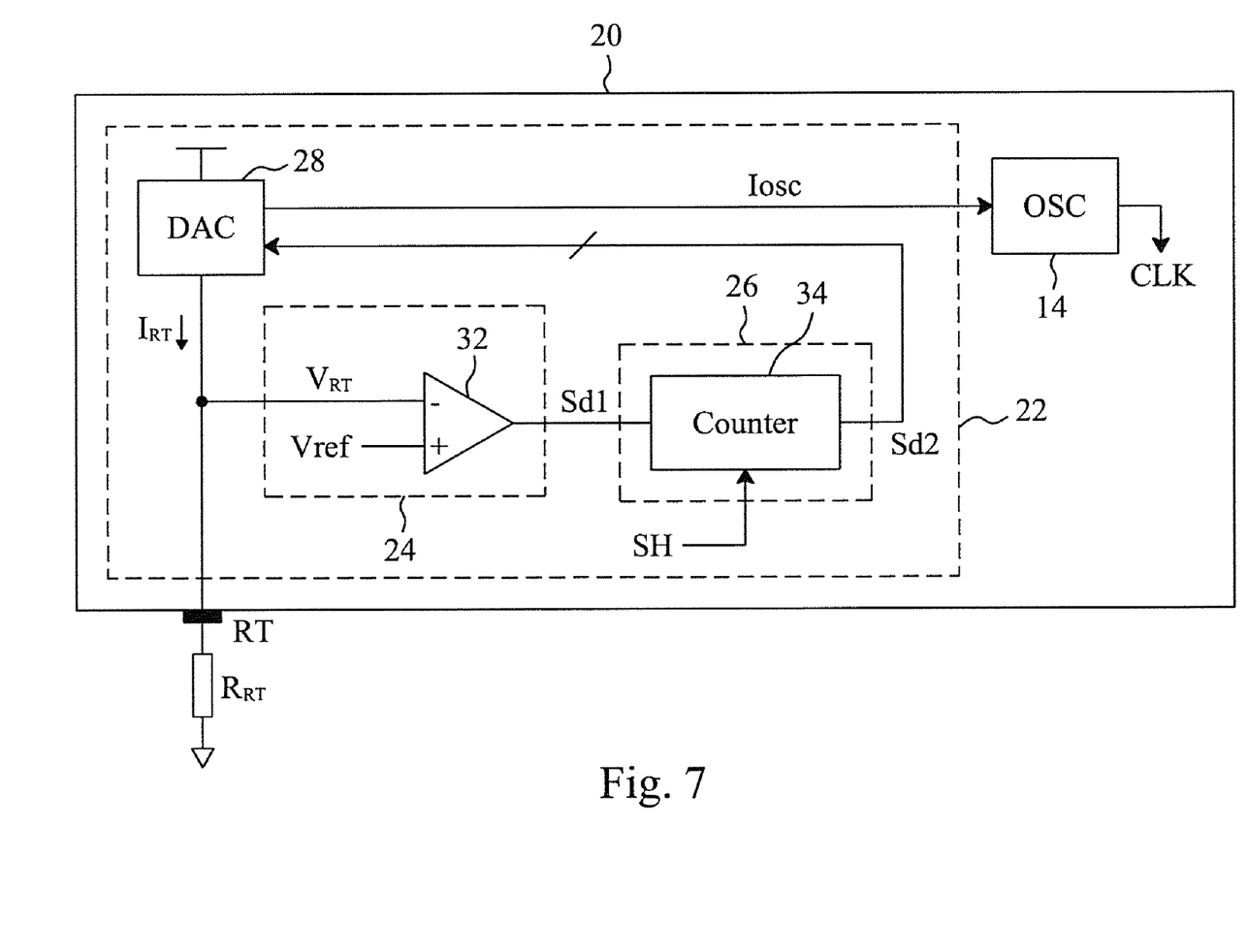
FIG. 7 is a second embodiment for the ADC, the storage element and the DAC of FIG. 3.

FIG. 7 is a second embodiment for the ADC 24, the storage element 26 and the DAC 28 of FIG. 3, in which the ADC 24 has the comparator 32, the storage element 26 has the counter 34, and the DAC 28 generates a current $I_{RT}$ and the frequency setting signal Iosc according to the second digital signal Sd2. The current $I_{RT}$ flows to the resistor $R_{RT}$ through the pin RT, so as to generate the voltage $V_{RT}$ as shown in the equation Eq-5. In this embodiment, the current $I_{RT}$ varies with the second digital signal Sd2, so the voltage $V_{RT}$ also varies with the second digital signal Sd2. In the ADC 24, the comparator 32 compares the voltage $V_{RT}$ with a reference voltage Vref to generate the first digital signal Sd1. The counter 34 of the storage element 26 adjusts the second digital signal Sd2 according to the first digital signal Sd1, so as to make the voltage $V_{RT}$ vary toward the reference voltage Vref. Assuming that the frequency setting signal Iosc is equal to the current $I_{RT}$, and the voltage $V_{RT}$ is equal to the reference voltage Vref, it is derived that $$Iosc=I_{RT}=Vref/R_{RT}. \quad [\text{Eq-8}]$$

By substituting the equation Eq-8 to the equation Eq-1, it is derived that the clock CLK will have the frequency $$Fclk=k1\times Vref/R_{RT}, \quad [\text{Eq-9}]$$

which shows that the frequency Fclk is inversely proportional to the resistance $R_{RT}$. As long as the counter 34 and the DAC 28 have enough bits N, the frequency setting circuit 22 is able to realize stepless frequency setting as a traditional analog circuit, as the curve shown in FIG. 2.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A frequency setting circuit for an integrated circuit including an oscillator providing a clock having a frequency depending on a frequency setting signal, the frequency setting circuit comprising:
   an analog-to-digital converter connected to a pin of the integrated circuit, operative to detect a first voltage at the pin during a frequency setting period to generate a first digital signal;
   a storage element connected to the analog-to-digital converter, operative to determine a second digital signal according to the first digital signal and store the second digital signal; and
   a digital-to-analog converter connected to the storage element, operative to generate the frequency setting signal according to the second digital signal.

2. The frequency setting circuit of claim 1, wherein the analog-to-digital converter is enabled during the frequency setting period, and is disabled after the frequency setting period.

3. The frequency setting circuit of claim 1, wherein the analog-to-digital converter comprises:
   a current source connected to the pin, providing a constant current to the pin so as to generate the first voltage; and
   a comparator connected to the pin, comparing the first voltage with a threshold to generate the first digital signal.

4. The frequency setting circuit of claim 3, wherein the storage element comprises a counter connected to the comparator, operative to adjust the second digital signal according to the first digital signal and store the second digital signal in response to a sampling signal.

5. The frequency setting circuit of claim 4, wherein the digital-to-analog converter is connected to the counter and the comparator, generating the threshold and the frequency setting signal according to the second digital signal.

6. The frequency setting circuit of claim 1, wherein the analog-to-digital converter comprises a comparator connected to the pin, comparing the first voltage with a reference voltage to generate the first digital signal.

7. The frequency setting circuit of claim 6, wherein the storage element comprises a counter connected to the comparator, operative to adjust the second digital signal according to the first digital signal and store the second digital signal in response to a sampling signal.

8. The frequency setting circuit of claim 7, wherein the digital-to-analog converter is connected to the counter and the pin, generating a current according to the second digital signal for applying to the pin to generate the first voltage.

9. A frequency setting method for an integrated circuit including an oscillator providing a clock having a frequency depending on a frequency setting signal, the frequency setting method comprising the steps of:
- (A) detecting a value of a frequency setting device on a pin of the integrated circuit during a frequency setting period to generate a first digital signal;
- (B) determining a second digital signal according to the first digital signal;
- (C) storing the second digital signal; and
- (D) determining the frequency setting signal according to the second digital signal.

10. The frequency setting method of claim 9, further comprising the step of stopping detecting the frequency setting device after the frequency setting period.

11. The frequency setting method of claim 9, wherein the step A comprises the steps of:
- providing a constant current to the frequency setting device to generate a first voltage;
- determining a threshold according to the second digital signal;
- comparing the first voltage with the threshold to generate the first digital signal; and
- adjusting the second digital signal according to the first digital signal.

12. The frequency setting method of claim 9, wherein the step A comprises the steps of:
- generating a current according to the second digital signal for applying to the frequency setting device to generate a first voltage;
- comparing the first voltage with a reference voltage to generate the first digital signal; and
- adjusting the second digital signal according to the first digital signal.

* * * * *